(12) United States Patent
Miura et al.

(10) Patent No.: US 6,433,649 B2
(45) Date of Patent: Aug. 13, 2002

(54) NON-RECIPROCAL CIRCUIT ELEMENT AND MILLIMETER-WAVE HYBRID INTEGRATED CIRCUIT BOARD WITH THE NON-RECIPROCAL CIRCUIT ELEMENT

(75) Inventors: Taro Miura, Tokyo; Makoto Hasegawa, Fukuoka; Takahide Kurahashi, Tokyo; Hidenori Ohata, Tokyo; Sakae Henmi, Tokyo; Kazuaki Suzuki, Toyko, all of (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/853,756

(22) Filed: May 14, 2001

Related U.S. Application Data

(63) Continuation of application No. PCT/JP00/06821, filed on Oct. 2, 2000.

(30) Foreign Application Priority Data

Jan. 10, 1999 (JP) ............................................. 11-281349

(51) Int. Cl.[7] .......................... H01P 1/375; H01P 1/387
(52) U.S. Cl. ........................................ 333/1.1; 333/24.2
(58) Field of Search ................................. 333/1.1, 24.2

(56) References Cited

U.S. PATENT DOCUMENTS

| | | | | |
|---|---|---|---|---|
| 3,928,824 A | * | 12/1975 | Takahashi et al. | ........... 333/1.1 |
| 4,205,281 A | * | 5/1980 | Nagao | ........................ 333/1.1 |
| H470 H | * | 5/1988 | Stern et al. | ................... 333/1.1 |

FOREIGN PATENT DOCUMENTS

| | | |
|---|---|---|
| JP | 64-1301 | 1/1989 |
| JP | 3-9504 | 1/1991 |
| JP | 8-204408 | 8/1996 |
| JP | 0964606 | 3/1997 |
| JP | 10-190315 | 7/1998 |
| JP | 2000-91814 | 3/2000 |
| JP | 2000-91815 | 3/2000 |
| JP | 2000-134007 | 5/2000 |
| JP | 2000-156601 | 6/2000 |

OTHER PUBLICATIONS

Renken, "Speed Circulator Design with Computer Modeling," Microwaves, vol.16, No. 6, pp. 54–64, Jun. 1977.*

* cited by examiner

Primary Examiner—Justin P. Bettendorf
(74) Attorney, Agent, or Firm—Armstrong, Westerman & Hattori, LLP

(57) ABSTRACT

A non-reciprocal circuit element includes a microstrip $TM_{n10}$ resonator (n is a positive integer) with a metal disk and branches projecting from the metal disk in a trigonally symmetric structure, and a ferrite magnetic body spontaneously magnetized and coaxially disposed on the microstrip $TM_{n10}$ resonator. The metal disk and the branches are formed on a non-magnetic dielectric board having a ground conductor on its bottom face. The ferrite magnetic body is arranged so that a position of an electric field node matches to one of the branches.

14 Claims, 7 Drawing Sheets

NON-RECIPROCAL CIRCUIT ELEMENT AND MILLIMETER-WAVE HYBRID INTEGRATED CIRCUIT BOARD WITH THE NON-RECIPROCAL CIRCUIT ELEMENT

CROSS-REFERENCES TO RELATED APPLICATIONS

This is a continuation of International Application PCT/JP00/06821, with an international filing date of Oct. 2, 2000.

FIELD OF THE INVENTION

The present invention relates to a non-reciprocal circuit element used for a millimeter-wave hybrid integrated circuit board provided with an active element such as a semiconductor element mounted thereon, and a millimeter-wave hybrid integrated circuit board with the non-reciprocal circuit element.

DESCRIPTION OF THE RELATED ART

In an active element mounted on a circuit such as a millimeter-wave circuit, transmitting radio wave having an extremely short wavelength, the following problems have occurred.

(1) Since a line length of the circuit is too long to be ignored relative to the wavelength, the reflection from the active element may produce a standing wave in the line causing change in the load impedance depending upon the frequency to easily occur; and (2) since a reverse-direction transfer coefficient cannot be reduced due to an existing inner capacitance of the active element, a back-flow of signals may extremely increase to cause an unstable phenomenon such as oscillation and runaway of the circuit or a large variation in a frequency characteristics of the circuit.

In order to solve such the problems, it is very effective to insert a non-reciprocal circuit element such as an isolator between active elements so as to reduce the standing wave.

A monolithic millimeter-wave integrated circuit has been demanded as a future semiconductor integrated circuit operating at a millimeter-wave range. However, because a current semiconductor element for a millimeter-wave range has a low manufacturing yield, mass production is quite difficult for a monolithic millimeter-wave integrated circuit. Therefore, in order to solve the yield problem, it is most effective to fabricate a millimeter-wave hybrid integrated circuit with a dielectric board. For a stable operation of such hybrid integrated circuit, a millimeter-wave isolator acts as an extremely important circuit element.

The operation of the millimeter-wave isolator requires a strong magnetic field. Namely, a typical circulator used at a microwave band or a higher-wave band called as a distributed element circulator consists of a $TM_{110}$ resonator with a magnetized ferrite body. A magnetic field to be applied to the ferrite body increases with the increase in frequency, and thus in the millimeter-wave band, a strong magnetic field of 5000 Oe or more is required. A conventional millimeter-wave isolator obtains such a strong magnetic field from an externally mounted magnetic circuit with an extremely large size. Therefore, it is hardly possible to mount the conventional millimeter-wave isolator and the magnetic circuit onto a millimeter-wave hybrid integrated circuit.

SUMMARY OF THE INVENTION

It is therefore an object of the present invention to provide a non-reciprocal circuit element which can be easily mounted onto a millimeter-wave hybrid integrated circuit board, and a millimeter-wave hybrid integrated circuit board with the non-reciprocal circuit element.

The present invention is intended (1) to mount a non-reciprocal circuit element such as an isolator on a millimeter-wave hybrid integrated circuit board so as to eliminate a wave reflected into the board, thereby stabilizing the circuit operation, and (2) to form a pattern, on the millimeter-wave hybrid integrated circuit board, for providing a non-reciprocal circuit element only by mounting a spontaneously magnetized ferrite body thereon as well as done in an ordinary component mounting process.

According to the present invention, a non-reciprocal circuit element includes a microstrip $TM_{n10}$ resonator (n is a positive integer) with a metal disk and branches projecting from the metal disk in a trigonally symmetric structure, and a ferrite magnetic body spontaneously magnetized and coaxially disposed on the microstrip $TM_{n10}$ resonator. The metal disk and the branches are formed on a non-magnetic dielectric board having a ground conductor on its bottom face. The ferrite magnetic body is arranged so that a position of an electric field node matches to one of the branches. Thus, the non-reciprocal circuit element can be easily mounted onto a millimeter-wave hybrid integrated circuit board.

In other words, according to the present invention, trigonally symmetric branches are provided between lines connecting integrated circuits on a millimeter-wave hybrid integrated circuit board that is constituted by a non-magnetic dielectric board and provided with a ground conductor on its back surface to form a $TM_{n10}$ resonator (n is a positive integer), and a magnetic body is disposed thereon to form a circulator. Additionally, a spontaneously magnetized ferrite magnetic body is used as the magnetic body eliminating the need for an external magnetic circuit. The ferrite magnetic body is magnetized and dimensioned such that a position of an electric field node matches to one of the branches (a third terminal not connected to the integrated circuit). If this third terminal is terminated by a matching resistor, an isolator is formed.

If a reflected wave between integrated circuits is absorbed by such a non-reciprocal circuit element, load impedance on a signal-transmitting side becomes constant regardless of input impedance on a signal-receiving side. Hence, it is possible to prevent problems such as oscillation and runaway of a power amplifier that are caused by the reflected wave in the circuit. Particularly in case of a millimeter wave band amplifier, since an increase in reverse-direction transfer constant of a transistor due to inner capacitance of the element cannot be ignored, it is quite important to make a signal to be directional in order to operate a circuit with stability.

Preferably the ferrite magnetic body has a shape of a disk or a cylinder.

It is preferred that the $TM_{n10}$ resonator is a $TM_{n10}$ resonator, where m is a positive integer of 2 or more. In this case, it is preferable to partially remove a portion of the metal disk around a central axis or a portion of the ferrite magnetic body and metal disk around the central axis. This arrangement makes it possible to reduce $TM_{010}$ mode, which is a resonance frequency of the $TM_{010}$ resonator, appearing in a resonance frequency band of the $TM_{n10}$ resonator.

As a modification, it is preferable to metallize an inner wall of a hole formed in the ferrite magnetic body by removing a portion around a central axis. Thus, the $TM_{010}$ mode can be suppressed more effectively.

It is also preferable to metallize at least the top and bottom faces of the ferrite magnetic body. Hence, it is possible to increase a magnetic flux appearing in the ferrite magnetic body.

It is also preferred that the $TM_{n10}$ resonator is a $TM_{110}$ resonator, and that a Faraday rotator with a ferrite cylinder that has a metallized free end face and a propagation length of one wavelength. As for a modification in this case, preferably a non-magnetic dielectric body is coupled to the ferrite cylinder.

It is preferred that a dielectric constant of the non-magnetic dielectric body is selected such that the ferrite cylinder and the non-magnetic dielectric body are equal to each other in characteristic impedance. This arrangement makes it possible to suppress reflection on a coupling surface between the ferrite cylinder and the non-magnetic dielectric body.

Preferably, ¼ wavelength impedance matching elements are connected to the branches, respectively. This arrangement makes it possible to widen an operational frequency band.

It is preferred that one terminal is connected to a matching resistor and other two terminals are formed as input and output terminals.

It is also preferred that the dielectric board is a millimeter-wave hybrid integrated circuit board.

According to the present invention, furthermore, a millimeter-wave hybrid integrated circuit board has at least one non-reciprocal circuit element mentioned above.

Further objects and advantages of the present invention will be apparent from the following description of the preferred embodiments of the invention as illustrated in the accompanying drawings.

DESCRIPTION OF THE PREFERRED EMBODIMENTS

Figure 1:
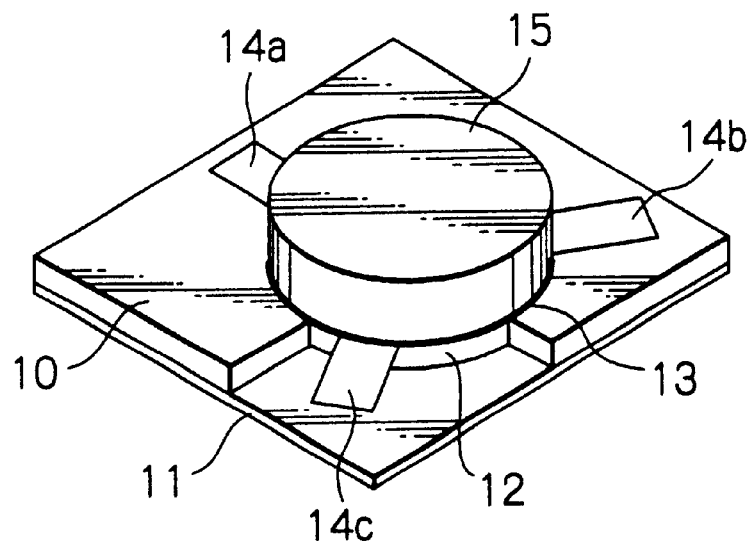
FIG. 1 shows a partially broken perspective view illustrating a conventional distributed element circulator with a typical configuration.

A distributed element circulator utilizes phenomena in which a propagating speed of a radio wave in a magnetized ferrite depends upon a rotational direction of a RF magnetic field applied to the ferrite. FIG. 1 illustrates is a partially cutaway perspective view showing a conventional typical distributed-element circulator.

In the figure, reference numeral 10 denotes a dielectric substrate or board, 11 a ground conductor formed on the bottom face of the dielectric board, 12 a ferrite disk inserted into a cut off portion of the dielectric board 10, 13 a metal disk formed on the top face of the ferrite disk 12, 14a, 14b and 14c terminals extending in a radial direction from the metal disk 13 in a trigonally symmetric structure, and 15 an exciting permanent magnet provided on the metal disk 13, respectively.

As will be noted, in the conventional typical distributed element circulator, the ferrite disk 12 is inserted between the ground electrode 11 and the metal disk 13 and the terminals of triple symmetry 14a, 14b and 14c are formed at the metal disk 13 to form a $TM_{110}$ resonator.

Whereas according to the present invention, a dielectric $TM_{n10}$ (n is a positive integer) mode resonator is used. Hereinafter, embodiments of the present invention will be described in detail.

Figure 2:
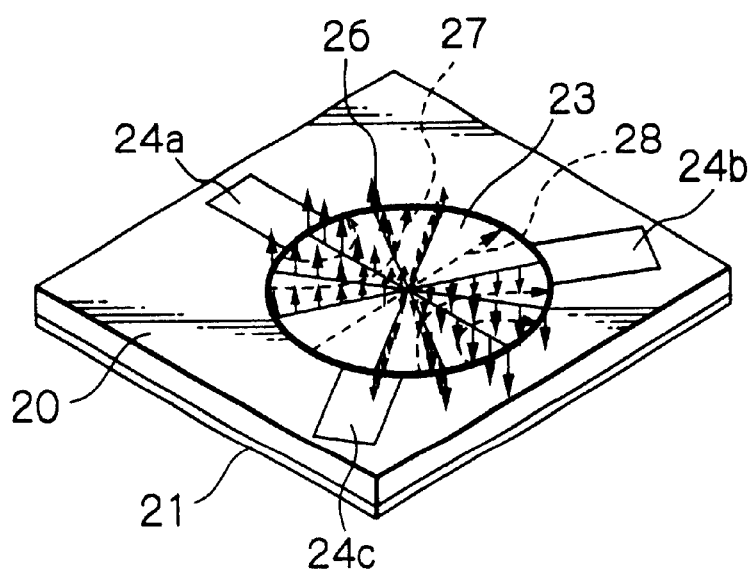
FIG. 2 shows an electric field distribution diagram of a dielectric $TM_{110}$ mode resonator in a preferred embodiment according to the present invention.
Figure 3:
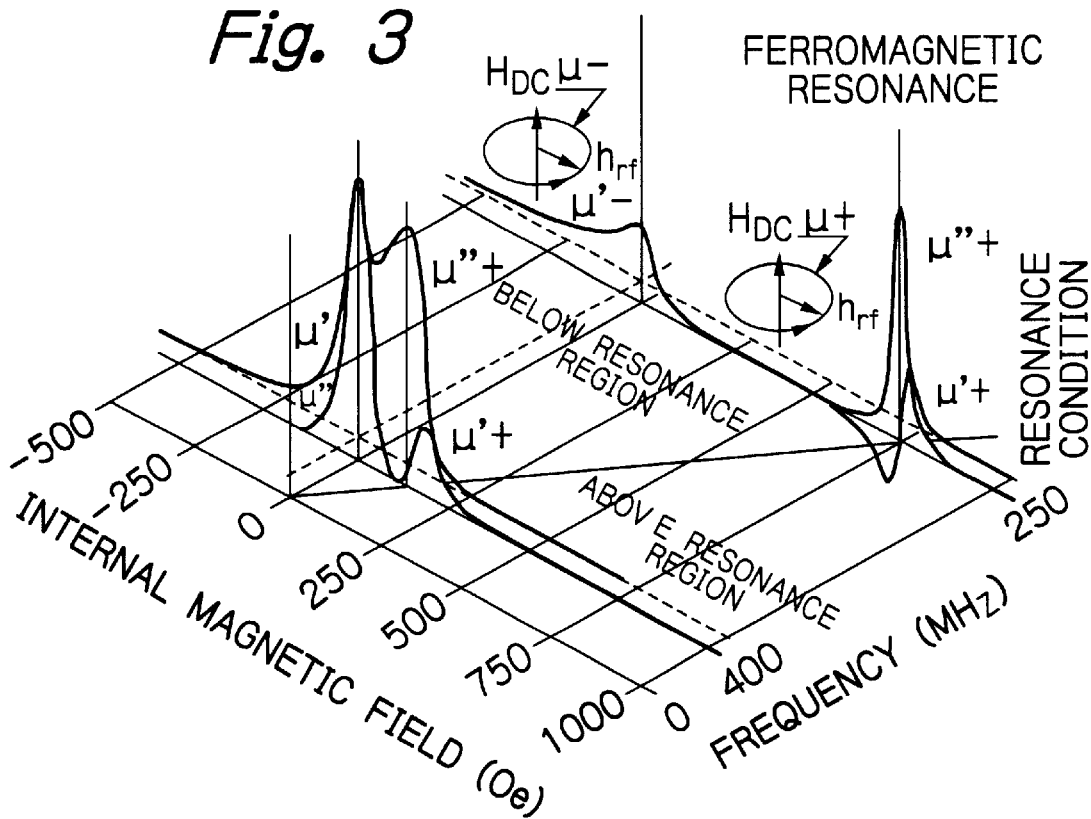
FIG. 3 shows a diagram illustrating a magnetic field-frequency characteristic of a gyro permeability.
Figure 4A:
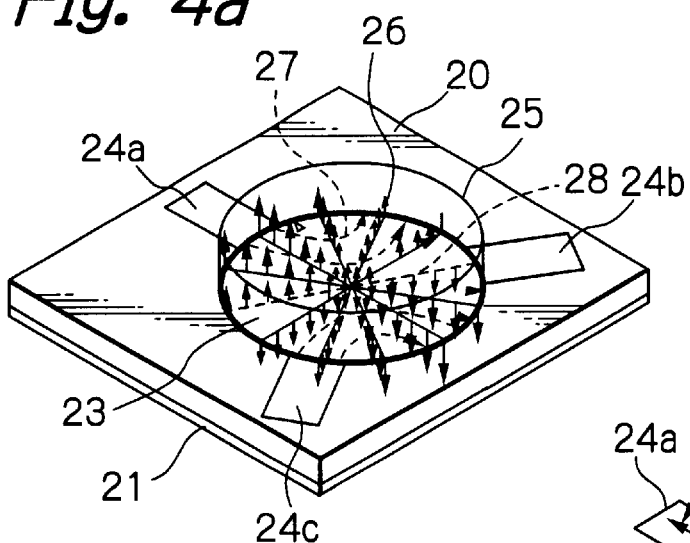
FIGS. 4a and 4b show a perspective view schematically illustrating the configuration of a circulator using the dielectric $TM_{110}$ mode resonator, and an electric field distribution diagram of the circulator.
Figure 4B:
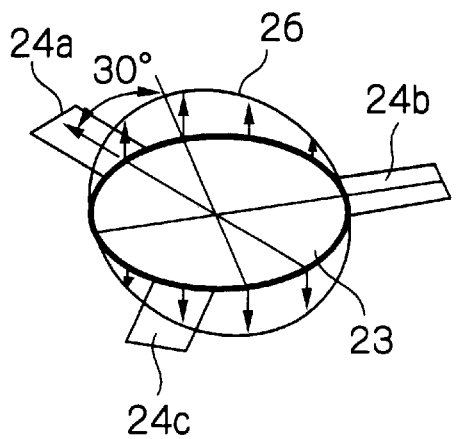

FIG. 2 illustrates an electric field distribution of a dielectric $TM_{110}$ mode resonator in a preferred embodiment according to the present invention, FIG. 3 illustrates a magnetic field versus frequency characteristic of gyro permeability, and FIGS. 4a and 4b schematically illustrate the configuration of a circulator using the dielectric $TM_{110}$ mode resonator and an electric field distribution in the circulator.

In these figures, reference numeral 20 denotes a dielectric board or substrate composed of a millimeter-wave hybrid integrated circuit board, 21 a ground conductor formed on the bottom face of the dielectric board 20, 23 a metal disk formed on the top face of the dielectric board 20, 24a, 24b and 24c terminals formed on the top face of the dielectric board 20 and extending in a radial direction from the metal disk 23 in a tigonally symmetric structure, and 25 a ferrite disk provided on the metal disk 23, respectively.

A radius of the metal disk 23 of the dielectric $TM_{110}$ mode resonator shown in FIG. 2 is given from the following equation (1);

$$J_0(ka) - (J_1(ka)/ka) = 0$$
$$k = 2\pi F \sqrt{\epsilon}/c \quad (1)$$

where, $J_n$ is an n-order Bessel function, k is the number of waves, $\epsilon$ is a dielectric constant of the board, F is a frequency (Hz), c is a speed of light (mm/sec) and a is a radius (mm) of the $TM_{n10}$ mode resonator.

In case that a board with a dielectric constant of $\epsilon=2$ is used for the dielectric $TM_{110}$ mode resonator operating at F=60 GHz, a radius of the metal disk is calculated as a=1.20 mm.

If a signal with a frequency satisfying the above condition is applied to the terminal 24a of the resonator, because a speed of a signal propagating on the metal disk 23 is equal in clockwise and counterclockwise directions, an electric field 26 and a magnetic field 27 on the metal disk 23 are distributed as shown in FIG. 2. Since an electric field node 28 on the resonator is orthogonal to the terminal 24a, the remaining terminals 24b and 24c output signals with the same amplitude. Such an isotropic output characteristic is achieved because an effective transmission-path length of a signal propagating counterclockwise and also of a signal propagating clockwise on the metal disk 23 is equal to an integral multiple of a half wavelength. Even if a signal is applied from the terminal 24b or 24c, the isotropic output will be obtained from the remaining two terminals 24a and 24c or the two terminals 24a and 24b, respectively.

A circulator is formed by mounting, on the metal disk 23 of the resonator, the ferrite disk 25 magnetized in the same direction as the central axis of the metal disk 23. The RF magnetic field 27 on the metal disk 23 is orthogonal to the magnetization direction of the ferrite disk 22 as shown in FIG. 2. If the RF magnetic field and the DC magnetic field are orthogonal to each other, the magnetic material body will provide a gyro permeability shown in FIG. 3 and thus signals propagating clockwise and counterclockwise differ in effective transmission path length due to the difference in permeability ($\mu_+$ and $\mu_-$) that depends upon the sense direction of the RF magnetic field. Assuming that adjustment is made such that the difference between a clockwise path length and a counterclockwise path length is equal to a half wavelength from the terminal 24a to the terminal 24b. In this case, since the electromagnetic field distribution becomes such that, as shown in FIG. 4a, the electric field node 28 matches to the terminal 24b, an output cannot be obtained from the terminal 24b and all signals appear at the terminal 24c. In such a three-terminals circulator, the terminal 24a is referred to as an input terminal, the terminal 24c as an output terminal, and the terminal 24b as an isolation terminal.

When a signal is applied to the terminal 24b, the relationship of the transmission path difference rotates counterclockwise by 120° and therefore the terminal 24b serves as an input terminal, the terminal 24c an output terminal, and the terminal 24a an isolation terminal. Since when an input terminal is changed, the relationship with an output terminal is accordingly changed in a circulating manner, such element is called as a circulator and such conditions for providing a transmission path difference is called as circulator conditions.

As will be understood from the above description, the circulator constituted by the $TM_{110}$ mode resonator is a non-reciprocal circuit element with an electric field node rotated by 30° according to a gyro permeability of a magnetic material body as shown in FIG. 4b.

It should be noted that such a resonator-type circulator is not limited to the $TM_{110}$ resonator but any $TM_{n10}$ resonator (n: a positive integer) can be used in a distributed element circulator if the $TM_{n10}$ resonator is constructed so that its electric field node matches to one of its terminals.

Because a gyro permeability appears due to ferromagnetic resonance, both permeabilities due to rotational directions of the RF magnetic field approach to one with an increase in a frequency as shown in FIG. 3. Thus, the difference in the permeabilities is reduced and therefore the circulator conditions cannot be satisfied. For this reason, in a frequency band such as a millimeter-wave band, it is necessary to increase the resonance frequency by applying a strong DC magnetic field and to increase the difference between permeabilities due to rotational directions.

If a millimeter-wave circuit circulator has a typical magnetic circuit for externally applying magnetic field, because of the large volume magnetic circuit, the size of the circulator becomes too large to fit into a board. A spontaneously magnetized ferrite such as a barium ferrite may be used to avoid increase in size of the magnetic circuit, as partially put into practice in the microwave band (W. W. Sienkanowicz et al., G-MTT Sym. Digest, p.79, May 1967). However, if the ferrite resonator is used, it is necessary, as shown in FIG. 1, to sandwich the ferrite disk 12 between the metal disk 13 and the ground conductor 11 causing the mounting of the circulator on the board to become extremely inconvenient.

Thus, in this embodiment, a $TM_{110}$ resonator is constructed by disposing a metal disk and trigonally symmetric terminals on the top face of a millimeter-wave hybrid integrated circuit board which is a dielectric board with a ground conductor covering its bottom face, and a ferrite body is disposed only on the upper face of the metal disk of the $TM_{110}$ resonator to form a circulator.

Therefore, the circulator can be constructed only by disposing the spontaneously magnetized ferrite magnetic body on the millimeter-wave hybrid integrated circuit board, resulting the mounting of the circulator to be extremely easily performed.

Figure 5:
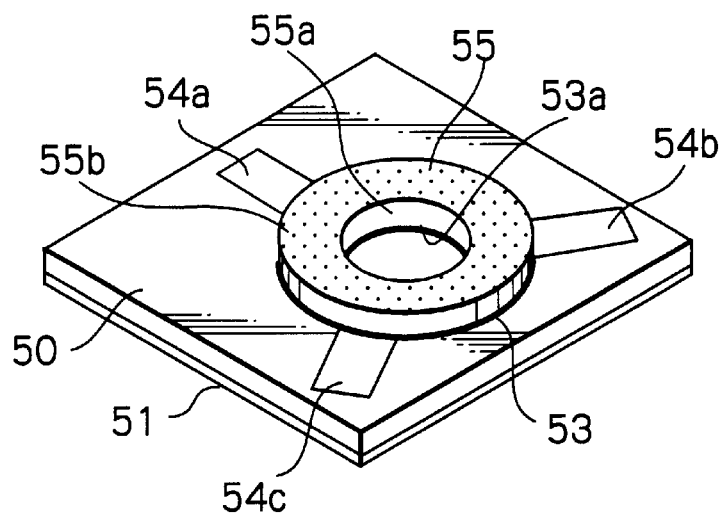
FIG. 5 shows a perspective view schematically illustrating the configuration of a circulator using a higher-order mode resonator in another embodiment according to the present invention.
Figure 6A:
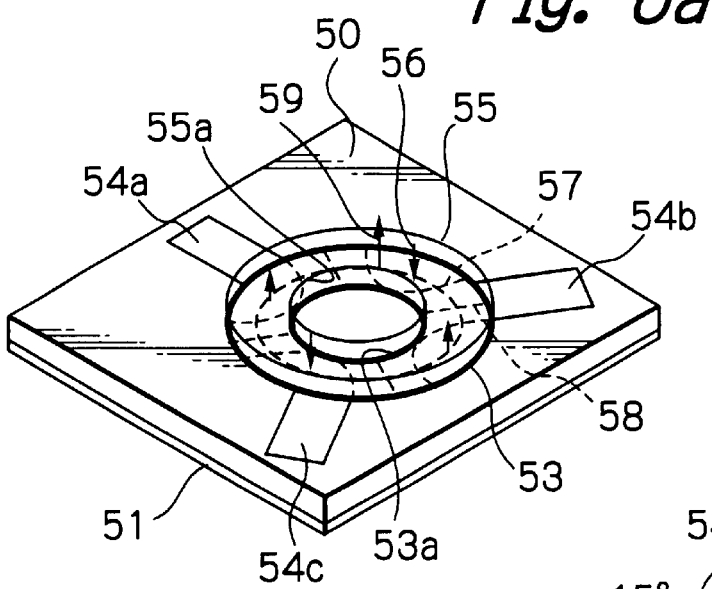
FIGS. 6a and 6b show perspective views illustrating the configuration of the circulator shown in FIG. 5 as well as its electromagnetic field distribution, and an electric field distribution diagram.
Figure 6B:
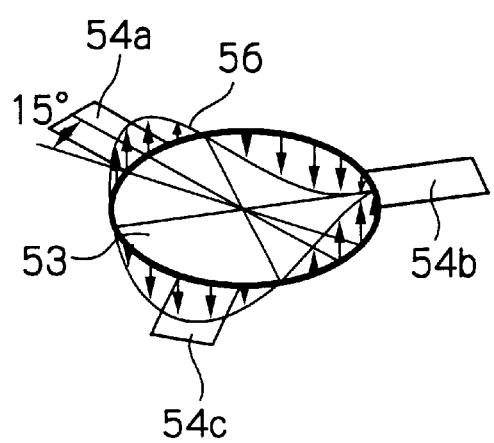
Figure 7:
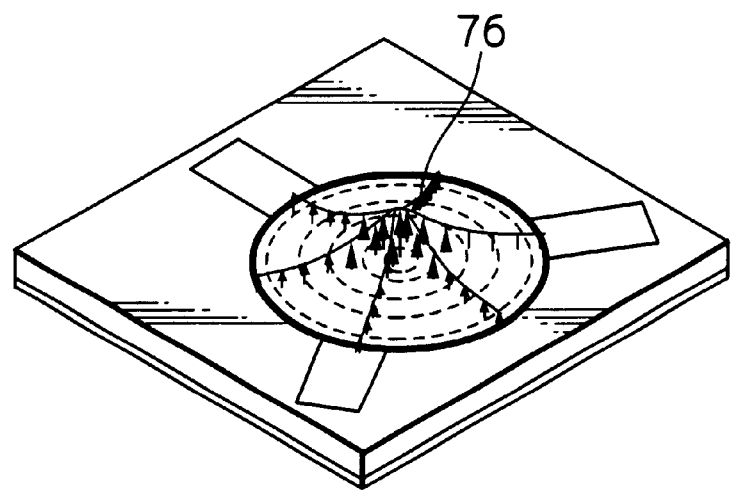
FIG. 7 shows an electric field distribution diagram of a $TM_{010}$ mode resonator.

FIG. 5 schematically illustrates the configuration of a circulator using a higher-order mode resonator in another embodiment according to the present invention, FIGS. 6a and 6b illustrate the configuration of the circulator and its electromagnetic field distribution, and FIG. 7 illustrates an electric field distribution in a $TM_{010}$ mode resonator.

In the above-mentioned circulator shown in FIGS. 2, 4a and 4b, in which the gyro magnetic body is mounted on the dielectric $TM_{110}$ resonator to rotate the electric field node, no rotation of the electric filed node will occur at the dielectric $TM_{110}$ resonator itself because this resonator is made of a non-magnetic dielectric material. Thus, it is necessary that the mounted gyro magnetic body rotates the electric field node by an angle approximately twice an electric field node rotational angle required for a typical circulator. The rotational angle of the electric field node increases in proportion to a saturation magnetization of the ferrite. However, since a barium ferrite has a small saturation magnetization, the assembling of a barium ferrite body with a $TM_{110}$ resonator will not provide a circulator with a sufficient rotational angle. For this reason, in this embodiment, instead of the conventional $TM_{110}$ resonator circulator, a higher-order mode resonator such as a $TM_{210}$ resonator is used to form a circulator.

In FIGS. 5, 6a and 6b, reference numeral 50 denotes a dielectric board or substrate composed of a millimeter-wave hybrid integrated circuit board, 51 a ground conductor formed on the bottom face of the dielectric board 50, 53 a metal disk provided with a through hole 53a at its center and formed on the top face of the dielectric board 50, 54a, 54b and 54c terminals formed on the top face of the dielectric board 50 and extending in a radial direction from the metal disk 53 in a tigonally symmetric structure, 55 a ferrite disk provided with a through hole 55a at its center and formed on the metal disk 53 so as to be magnetized in the same direction as the central axis of the metal disk 53, 56 an electric field, 57 a magnetic field, 58 an electric field node, and 59 DC magnetization, respectively.

In this embodiment, a $TM_{210}$ resonator is constructed by disposing a metal disk and trigonally symmetric terminals on the top face of a millimeter-wave hybrid integrated circuit board which is a dielectric board with a ground conductor covering its bottom face, and a ferrite body is disposed only on the upper face of the metal disk of the $TM_{210}$ resonator to form a circulator.

As aforementioned, a circulator can be formed by using a $TM_{n10}$ resonator if its electric field node matches to the isolation terminal. In case of using a $TM_{210}$ mode resonator, the circulator will be formed by matching the electric field node to a rotational angle of 15°. Namely, according to this embodiment, by using a higher-order $TM_{n10}$ mode resonator, a circulator can be provided even if a magnetic body such as a barium ferrite body having a small difference in permeabilities due to magnetic field rotational directions is used and it results a small rotational angle of the electric field node.

Although the higher-order mode resonator is larger in size than a fundamental mode resonator, as long as used for a signal with a short wavelength such as a millimeter wave, it is possible to provide a circulator that sufficiently matches with a circuit element in size.

In many higher-order mode resonators, a resonance frequency of the $TM_{010}$ mode appears at a lower frequency than that of the corresponding higher-order mode, and the $TM_{010}$ mode may coexist with the higher-order mode. As shown in FIG. 7, since the $TM_{010}$ resonance mode does not have an electric field node, a circulator cannot be formed and the operation of the circulator is interfered by the coexistence of an electric field 76 concentrating at a central part.

Therefore, in this embodiment, the through hole 53a is formed to remove the central part of the metal disk 53 so that an electric field does not appear at a central axis. Thus, the resonance frequency of the $TM_{010}$ mode in the circulator is shifted to a higher frequency than the $TM_{n10}$ mode resonance frequency.

In this embodiment, a ferrite magnetic body is disposed only on t he upper side of the resonator, unlike the conventional circulator having ferrite bodies with a non-reciprocal transmitting property on top and bottom faces of the resonator. Thus, in designing the circulator, it is difficult to analytically determine the conditions of the circulator. Therefore, in this embodiment, a design method based on sequential approximation as follows is adopted.

First, a disk diameter of a $TM_{210}$ mode resonator of the dielectric board is calculated. Then, a magnetized ferrite disk with a thickness is mounted thereon to form a circulator. The thickness of the ferrite disk is determined by considering a fact that a transmission path difference varies substantially in proportion to the thickness of the ferrite disk.

Assuming that a circulator is mounted onto a millimeter-wave hybrid integrated circuit board including a plurality of semiconductor elements mounted on a dielectric board with a dielectric constant of $\epsilon=2$. A radius a (mm) of a resonating disk with the $TM_{210}$ mode is calculated by equation (2);

$$J_1(ka)-(2J_2(ka)/ka)=0$$
$$k=2\pi F\sqrt{\epsilon}/c \qquad (2).$$

Minimum ka satisfying this equation is 3.05. Therefore, in the $TM_{210}$ mode resonator operating at 60 GHz on the board having the dielectric constant of $\epsilon=2$, the radius a of the metal disk 53 is determined to a =1.98 mm.

On the metal disk 53, the ferrite disk 55 made of a barium ferrite and equal to the metal disk 53 in diameter, with a thickness satisfying the circulator conditions is disposed. As shown in FIG. 6a, in the $TM_{210}$ mode, the RF magnetic field 57 hardly exists at the center of the ferrite disk 55. Thus, the through hole 55a is formed at the center of the ferrite disk 55 in the same manner as the metal disk 53 to prevent the occurrence of the $TM_{010}$ mode.

In this embodiment, a top face 55b and the bottom face of the ferrite disk 55 are metallized by evaporating or plating a metal. This metallization aims to increase a magnetic flux appearing inside of the ferrite disk but is not always necessary to form the circulator of the present invention.

As will be apparent from FIG. 3, gyro magnetization is observed in regions lower and higher than the resonance condition or the resonance magnetic field. As for a circulator such as a millimeter-wave circulator requiring a high DC magnetic field, gyro magnetization appearing in the below resonance region is used. Assuming that a gyro permeability is roughly estimated based on a saturation magnetization of 3500 G of the barium ferrite and an internal magnetic field of 5000 Oe, the thickness of the ferrite disk 55 in the circulator operating at 60 GHz is determined to 0.5 mm.

Other configurations, advantages and modifications of this embodiment are the similar to those of the embodiment shown in FIG. 2.

Figure 8:
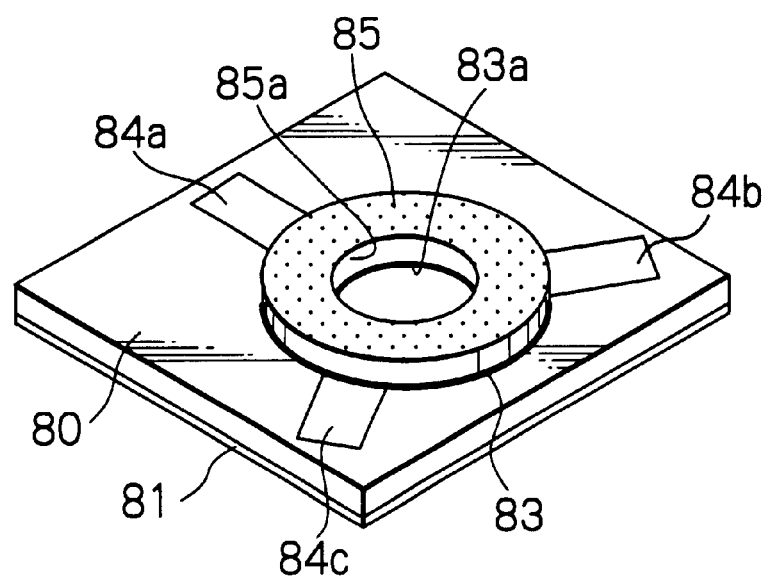
FIG. 8 shows a perspective view schematically illustrating the configuration of a circulator using a higher-order mode resonator in a further embodiment according to the present invention.

FIG. 8 schematically illustrates the configuration of a circulator using a higher-order mode resonator in a further embodiment according to the present invention.

In the figure, reference numeral 80 denotes a dielectric board or substrate composed of a millimeter-wave hybrid integrated circuit board, 81 a ground conductor formed on the bottom face of the dielectric board 80, 83 a metal disk provided with a through hole 83a at its center and formed on the top face of the dielectric board 80, 84a, 84b and 84c terminals formed on the top face of the dielectric board 80 and extending in a radial direction from the metal disk 83 in a tigonally symmetric structure, and 85 a ferrite disk provided with a through hole 85a at its center and formed on the metal disk 83 so as to be magnetized in the same direction as the central axis of the metal disk 83, respectively.

In this embodiment as well as in the embodiment of FIG. 5, a $TM_{210}$ resonator is constructed by disposing a metal disk and trigonally symmetric terminals on the top face of a millimeter-wave hybrid integrated circuit board which is a dielectric board with a ground conductor covering its bottom face, and a ferrite body is disposed only on the upper face of the metal disk of the $TM_{210}$ resonator to form a circulator. Although only the top and bottom faces of the ferrite disk are metallized in the embodiment of FIG. 5, the inner wall of the through hole 85a in the ferrite disk 85 is additionally metallized by evaporating or plating metal in this embodiment. With this arrangement, it is possible to suppress a $TM_{010}$ mode more effectively.

Other configurations, advantages and modifications of this embodiment are the similar to those of the embodiment shown in FIG. 5.

Figure 9:
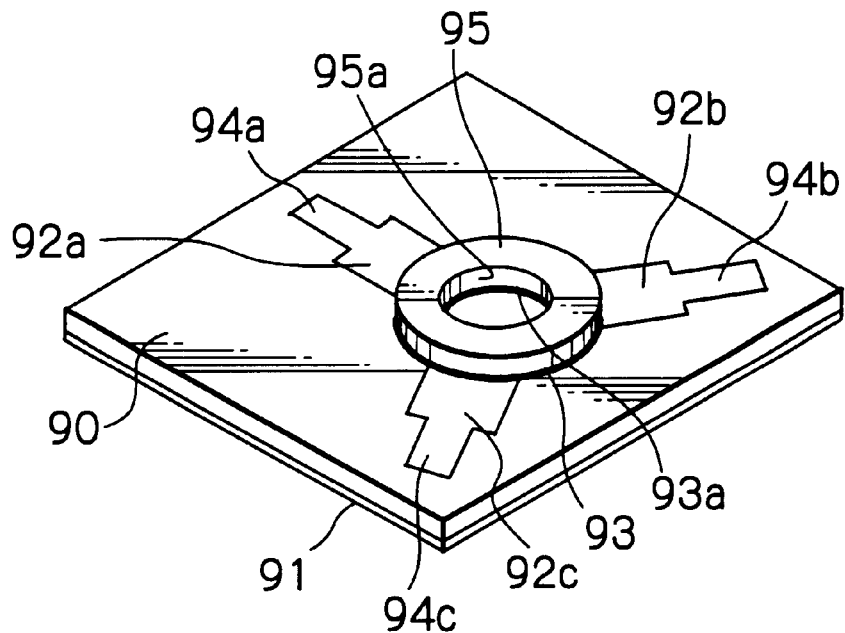
FIG. 9 shows a perspective view schematically illustrating the configuration of a circulator using a higher-order mode resonator in a still further embodiment according to the present invention.

FIG. 9 schematically illustrates the configuration of a circulator using a higher-order mode resonator in a still further embodiment according to the present invention.

In the figure, reference numeral 90 denotes a dielectric board or substrate composed of a millimeter-wave hybrid integrated circuit board, 91 a ground conductor formed on the bottom face of the dielectric board 90, 93 a metal disk provided with a through hole 93a at its center and formed on the top face of the dielectric board 90, 94a, 94b and 94c terminals formed on the top face of the dielectric board 90 and extending in a radial direction from the metal disk 93 in a tigonally symmetric structure, and 95 a ferrite disk provided with a through hole 95a at its center and formed on the metal disk 93 so as to be magnetized in the same direction as the central axis of the metal disk 93, respectively.

Also in this embodiment as well as in the embodiment of FIG. 5, a $TM_{210}$ resonator is constructed by disposing a metal disk and trigonally symmetric terminals on the top face of a millimeter-wave hybrid integrated circuit board which is a dielectric board with a ground conductor covering its bottom face, and a ferrite body is disposed only on the upper face of the metal disk of the $TM_{210}$ resonator to form a circulator.

Further, in this embodiment, ¼ wavelength impedance transformers 92a, 92b and 92c are respectively inserted into the terminals (branches) 94a, 94b and 94c so as to widen an operational frequency band of the circulator. This arrangement is provided to solve a problem of a narrow operational frequency band caused by the higher-order mode circulator in which an electric field node shifts largely depending upon the frequency.

In the present embodiment as well as in the embodiment of FIG. 5, the top and bottom faces of the ferrite disk may be metallized. Further, as in the embodiment of FIG. 8, the inner wall of the through hole in the ferrite disk may additionally be metallized.

Other configurations, advantages and modifications of this embodiment are the similar to those of the embodiments shown in FIGS. 5 and 8. It is self-evident that the mode number m is not limited to 2, but m≧3. Namely, a circulator can be obtained equivalent to the circulator in this embodiment as long as the circulator conditions of that an electric field node conforms to one of the terminals is satisfied even under a whispering gallery mode of m≧3.

Figure 10:
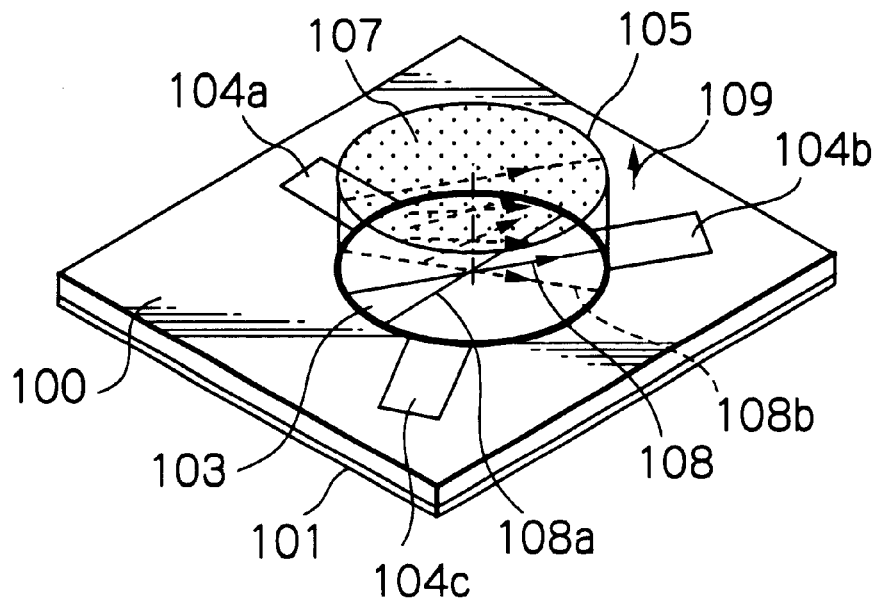
FIG. 10 shows a perspective view schematically illustrating the configuration of a circulator using a Faraday rotator as well as its electromagnetic field distribution in a further embodiment according to the present invention.

FIG. 10 schematically illustrates the configuration of a circulator using Faraday rotator as well as its electromagnetic field distribution in a further embodiment according to the present invention.

In the figure, reference numeral 100 denotes a dielectric board or substrate composed of a millimeter-wave hybrid integrated circuit board, 101 a ground conductor formed on the bottom face of the dielectric board 100, 103 a metal disk formed on the top face of the dielectric board 100, 104a, 104b and 104c terminals formed on the top face of the dielectric board 100 and extending in a radial direction from the metal disk 103 in a tigonally symmetric structure, 105 a ferrite cylinder formed on the metal disk 103 so as to be magnetized in the same direction as the central axis of the metal disk 103, 107 a short-circuit plate constituted by a metal plate formed on the top end face of the ferrite cylinder 105, 108a an electric field node of a dielectric resonator, 108b an electric field node of a Faraday resonator, 108 a combined electric field node which is a combination of the above-mentioned nodes, and 109 DC magnetization, respectively.

In this embodiment, a $TM_{n10}$ resonator is constructed by disposing a metal disk and trigonally symmetric terminals on the top face of a millimeter-wave hybrid integrated circuit board which is a dielectric board with a ground conductor covering its bottom face, and a ferrite cylinder or a Faraday rotator is disposed only on the upper face of the metal disk of the $TM_{n10}$ resonator to form a circulator.

A circulator constituted by combining transmitting properties of resonators disposed on both the top and bottom faces of a dielectric board can be realized, as well as the $TM_{n10}$ mode resonator using the ferrite body, from a dielectric $TM_{n10}$ mode resonator and a Faraday rotator with a electric field node rotation satisfying the circulator conditions mounted on the dielectric $TM_{n10}$ mode resonator as in this embodiment.

Now, the operating principles of the circulator using the Faraday rotator will be described based on a Faraday effect.

If a RF signal with a magnetic field orthogonal to a DC magnetization axis is propagated through a ferrite cylinder which is DC magnetized in a central axis direction, the direction (plane of polarization) of the RF electromagnetic field will rotate together with the signal propagation. This is because the propagation of the RF magnetic field differs between rotational directions. Such rotation of the polarization plane is called as a Faraday effect. In case that the applied magnetic field is lower than a resonance magnetic field, the polarization plane rotates in a negative direction (clockwise direction) relative to the propagating direction.

As shown in FIG. 10, in this embodiment, one end of the ferrite cylinder 105 is short-circuited by the metal plate 107 and this ferrite cylinder 105 is disposed on the dielectric resonator. If the ferrite cylinder 105 is spontaneously magnetized in its central axis direction, an electromagnetic wave applied from the dielectric resonator to the ferrite cylinder 105 rotates its polarization plane while being propagated by the Faraday effect. The electric field node 108b in the ferrite cylinder 105 also rotates in the same manner. Here, a rotational angle of the polarization plane or the electric field node is represented by θ. The electromagnetic wave reaching the top end face of the ferrite cylinder 105 is reflected on the metal plate 107 and reverses its propagating direction. This reflected wave further rotates the electric field node 108b due to the Faraday effect, and the rotational angle of the electric field node becomes 2θ at the top face of the dielectric resonator. The electric field node 108 on a resonator is determined by combining the electric field node 108a of the dielectric resonator mainly constituted by the dielectric board and the electric field node 108b rotated in the ferrite cylinder 105. Thus, when the combined electric field node 108 matches to one of the terminals other than the input terminal, the resonator can act as a circulator using the matched terminal as an isolation terminal.

In such the circulator, the rotational angle of the electric field node is determined in accordance with an axial length of the ferrite cylinder 105. Therefore, even if the resonator on the board section has a $TM_{n10}$ mode, it is possible to obtain a necessary rotation of the electric field node contributing to downsizing of the circulator.

In case of a $TM_{110}$ mode Faraday rotating circulator operating at 60 GHz formed on a dielectric board with a dielectric constant of ϵ=2, a diameter of the metal disk of the $TM_{110}$ mode resonator is determined to D=2.40 mm according to equation (1). It is assumed that the barium ferrite cylinder is equal to the metal disk in diameter and that an inner line length of the cylinder is one wavelength. Since an internal DC magnetic field is lower than a resonance magnetic field in this embodiment, an average relative permeability that is an average value of relative gyro permeabilities for positive and negative rotating magnetic fields becomes 0.8. A propagating wavelength in the cylinder is reduced to a geometric average value of the dielectric constant and the average relative permeability. If barium ferrite has a dielectric constant of ϵ=16, a wavelength reduction ratio becomes 1/3.51 and a length of the ferrite cylinder becomes 1.40 mm.

Other configurations, advantages and modifications of this embodiment are the same as those of the embodiments shown in FIGS. 5, 8 and 9.

Figure 11:
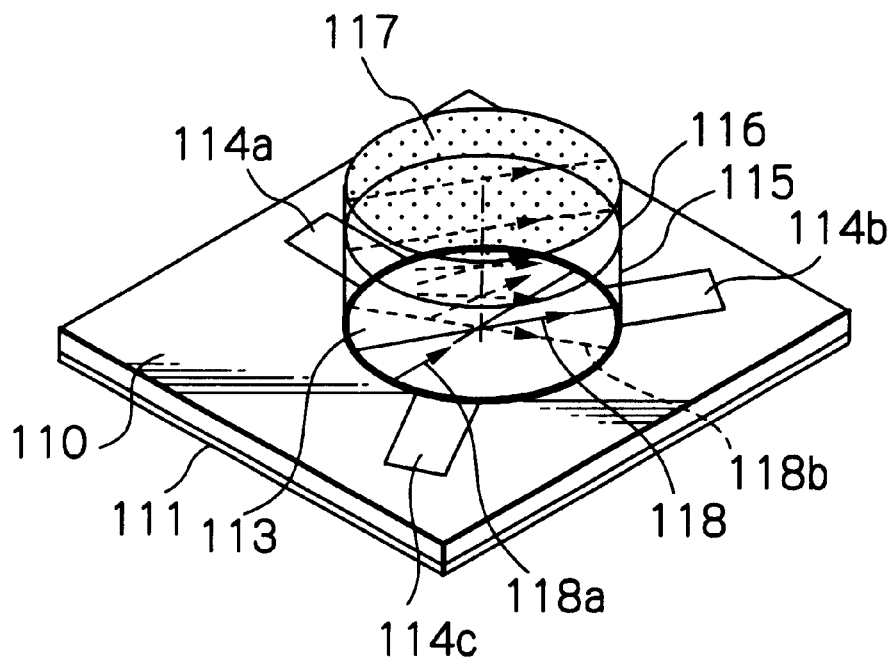
FIG. 11 shows a perspective view schematically illustrating the configuration of a circulator using a Faraday rotator as well as its electromagnetic field distribution in a still further embodiment according to the present invention.

FIG. 11 schematically illustrates the configuration of a circulator using Faraday rotator as well as its electromagnetic field distribution in a still further embodiment according to the present invention.

In the figure, reference numeral 110 denotes a dielectric board or substrate composed of a millimeter-wave hybrid integrated circuit board, 111 a ground conductor formed on the bottom face of the dielectric board 110, 113 a metal disk formed on the top face of the dielectric board 110, 114a, 114b and 114c terminals formed on the top face of the dielectric board 110 and extending in a radial direction from the metal disk 113 in a tigonally symmetric structure, 115 a ferrite cylinder formed on the metal disk 113 so as to be magnetized in the same direction as the central axis of the metal disk 113, 116 a dielectric cylinder attached to the top face of the ferrite cylinder 115, 117 a short-circuit plate constituted by a metal plate formed on the top end face of the dielectric cylinder 116, 118a an electric field node of a dielectric resonator, 118b an electric field node of a Faraday resonator, and 118 a combined electric field node which is a combination of the above-mentioned nodes, respectively.

In this embodiment, a $TM_{n10}$ resonator is constructed by disposing a metal disk and trigonally symmetric terminals on the top face of a millimeter-wave hybrid integrated circuit board which is a dielectric board with a ground conductor covering its bottom face, and a ferrite cylinder or a Faraday rotator is disposed only on the upper face of the metal disk of the $TM_{n10}$ resonator to form a circulator. Particularly, in this embodiment, the dielectric cylinder 116, one end of which is short-circuited by the metal plate 117, is coupled to the ferrite cylinder 115.

If the dielectric resonator is constituted by a non-magnetic dielectric board, the ferrite cylinder will act as an independent resonator and needs to produce resonance in phase with the dielectric resonator formed at the dielectric board. Therefore, in this case, an inner line length of the ferrite cylinder is required to be equal to a wavelength. However, it is difficult to simultaneously satisfy both requirements for a rotational angle of the electric field node and for the line length. Thus, in this embodiment, the dielectric cylinder 116 is connected to the ferrite cylinder 115 so as to provide a function of adjusting only a phase amount regardless of rotation in the electric field node.

In order to prevent reflection on a coupling face to the ferrite body, it is preferable that a dielectric constant of the dielectric cylinder 116 for adjusting a phase be set to a value whereby the ferrite cylinder 115 and the dielectric cylinder 116 are equal to each other in characteristic impedance. A relative dielectric constant $\epsilon_d$ of the dielectric cylinder 116 is calculated by equation (3), so that matching can be achieved on the coupling face;

$$\sqrt{1/\epsilon_d} = \sqrt{\mu_f/\epsilon_f} \qquad (3)$$

where $\epsilon_d$ is a relative dielectric constant of the dielectric cylinder for adjusting a phase, $\mu_f$ is an average relative permeability of the ferrite cylinder, and $\epsilon_f$ is a relative dielectric constant of the ferrite cylinder.

A thickness of the dielectric cylinder 116 may be determined to any value because a necessary thickness of the dielectric body for constituting a circulator differs depending upon positive and negative gyro permeabilities. However, the thickness of the dielectric cylinder 116 will be normally set at about 0.1 to 0.2 wavelength so as to not exceed a range of a phase adjustment element.

In such the circulator, the rotational angle of the electric field node is determined in accordance with an axial length of the ferrite cylinder 115. Therefore, even if the resonator on the board section has a $TM_{n10}$ mode, it is possible to obtain a necessary rotation of the electric field node contributing to downsizing of the circulator.

Other configurations, advantages and modifications of this embodiment are the same as those of the embodiments shown in FIGS. 5, 8, 9 and 10.

Figure 12:
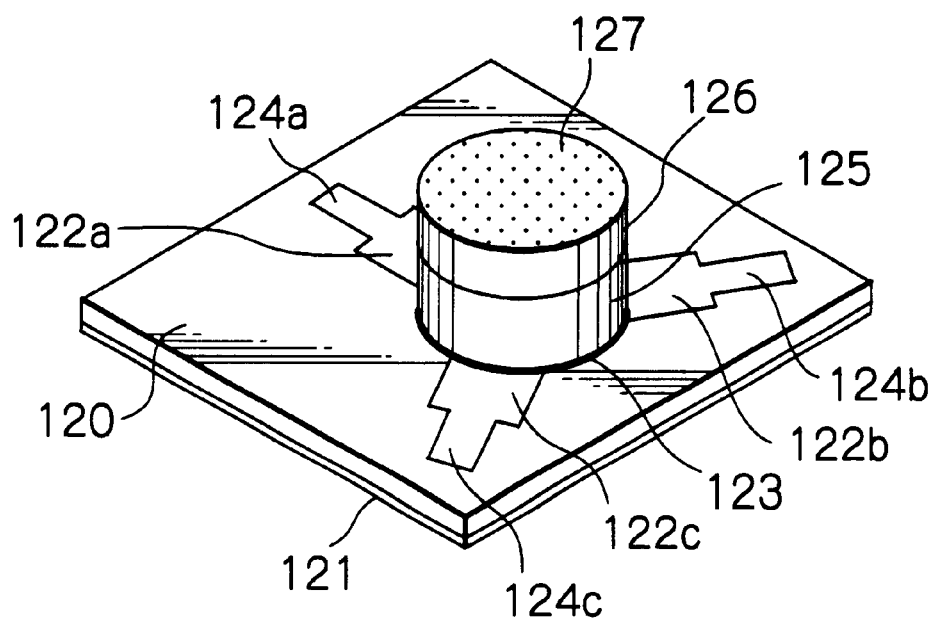
FIG. 12 shows a perspective view schematically illustrating the configuration of a circulator using a Faraday rotator as well as its electromagnetic field distribution in a further embodiment according to the present invention.

FIG. 12 schematically illustrates the configuration of a circulator using Faraday rotator as well as its electromagnetic field distribution in a further embodiment according to the present invention.

In the figure, reference numeral 120 denotes a dielectric board or substrate composed of a millimeter-wave hybrid integrated circuit board, 121 a ground conductor formed on the bottom face of the dielectric board 120, 123 a metal disk formed on the top face of the dielectric board 120, 124a, 124b and 124c terminals formed on the top face of the dielectric board 120 and extending in a radial direction from the metal disk 123 in a tigonally symmetric structure, 125 a ferrite cylinder formed on the metal disk 123 so as to be magnetized in the same direction as the central axis of the metal disk 123, 126 a dielectric cylinder attached to the top face of the ferrite cylinder 125, and 127 a short-circuit plate constituted by a metal plate formed on the top end face of the dielectric cylinder 126, respectively.

In this embodiment as well as the embodiment of FIG. 11, a $TM_{n10}$ resonator is constructed by disposing a metal disk and trigonally symmetric terminals on the top face of a millimeter-wave hybrid integrated circuit board which is a dielectric board with a ground conductor covering its bottom face, and a ferrite cylinder or a Faraday rotator is disposed only on the upper face of the metal disk of the $TM_{n10}$ resonator to form a circulator. Also, the dielectric cylinder 126, one end of which is short-circuited by the metal plate 127, is coupled to the ferrite cylinder 125.

Furthermore, in this embodiment, ¼ wavelength impedance transformers 122a, 122b and 122c are respectively inserted into the terminals (branches) 124a, 124b and 124c so as to widen an operational frequency band of the circulator. This arrangement is provided to solve a problem of a narrow operational frequency band caused by the higher-order mode circulator in which an electric field node shifts largely depending upon the frequency.

Other configurations, advantages and modifications of this embodiment are the same as those of the embodiments shown in FIGS. 5, 8, 9, 10 and 11.

Figure 13:
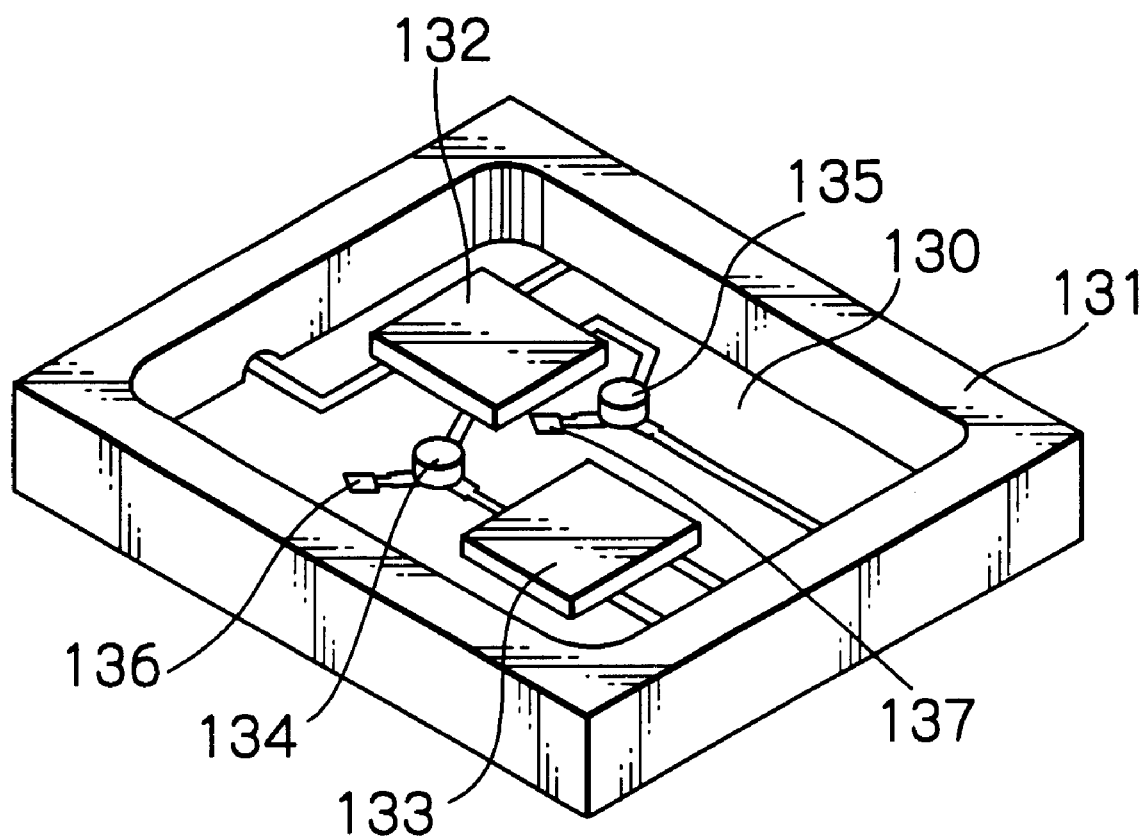
FIG. 13 shows a perspective view schematically illustrating the configuration of a millimeter-wave hybrid integrated circuit board on which a non-reciprocal circuit element according to the present invention is mounted.

FIG. 13 schematically illustrates the configuration of a millimeter-wave hybrid integrated circuit board on which a non-reciprocal circuit element of the present invention is mounted.

In the figure, reference numeral 130 denotes a dielectric board which is a millimeter-wave hybrid integrated circuit board mounted in a package 131, 132 and 133 active elements such as semiconductor integrated circuits mounted on the dielectric board 130, 134 and 135 circulators/isolators formed on the dielectric board 130 with the similar configuration of the aforementioned embodiments, and 136 and 137 matching resistances, respectively. Although it is not shown in FIG. 13, a ground conductor is formed on the bottom face of the dielectric board 130 to cover the whole surface.

In the hybrid integrated circuit constructed by mounting a plurality of the active elements 132 and 133 on the dielectric board 130, trigonally symmetric branches are provided on a line for connecting two circuits, and metal disks are formed on the symmetric centers to make dielectric circular $TM_{n10}$ resonators (n is a positive integer). A spontaneously magnetized ferrite disk, a spontaneously magnetized ferrite cylinder, or a cylinder with the ferrite cylinder and a phase-adjusting dielectric cylinder coupled to the ferrite cylinder is disposed on each of the metal disks to constitute circulator. The branches which are not connected to the circuits on the dielectric board 130 are terminated by the matching resistances 136 and 137 to form isolators for removing interference between circuits.

If the above-mentioned branches, matching resistances and metal disks are formed in a manufacturing process for forming the dielectric board 130, it is possible to readily form isolators, which are key parts for operating the millimeter-wave integrated circuit with stability on the millimeter-wave hybrid integrated circuit board, only by mounting spontaneously magnetized barium ferrite bodies on patterns for $TM_{n10}$ resonators in a similar process to a process of mounting the active elements 132 and 133. Therefore, it is not necessary to connect the circulator by using a connector and/or to mount element into the board as the conventional technique, and mounting of circulators and/or isolators can be executed in a production line as well as done in an ordinary component mounting process. Consequently, it is possible to greatly contribute to the stability and mass production of the millimeter-wave integrated circuit.

As described above in detail, according to the present invention, a non-reciprocal circuit element includes a microstrip $TM_{n10}$ resonator (n is a positive integer) with a metal disk and branches projecting from the metal disk in a trigonally symmetric structure, and a ferrite magnetic body spontaneously magnetized and coaxially disposed on the microstrip $TM_{n10}$ resonator. The metal disk and the branches are formed on a non-magnetic dielectric board having a ground conductor on its bottom face. The ferrite magnetic body is arranged so that a position of an electric field node matches to one of the branches. Thus, the non-reciprocal circuit element can be easily mounted onto a millimeter-wave hybrid integrated circuit board.

If a reflected wave between integrated circuits is absorbed by such a non-reciprocal circuit element, load impedance on a signal-transmitting side becomes constant regardless of input impedance on a signal-receiving side. Hence, it is possible to prevent problems such as oscillation and run-away of a power amplifier that are caused by the reflected wave in the circuit. Particularly in case of a millimeter wave band amplifier, since an increase in reverse-direction transfer constant of a transistor due to inner capacitance of the element cannot be ignored, it is quite important to make a signal to be directional in order to operate a circuit with stability.

Many widely different embodiments of the present invention may be constructed without departing from the spirit and scope of the present invention. It should be understood that the present invention is not limited to the specific embodiments described in the specification, except as defined in the appended claims.

What is claimed is:

1. A non-reciprocal circuit element, comprising:
   a microstrip isotropic $TM_{n10}$ resonator (n is a positive integer) further comprising a metal disk including branches projecting from said metal disk in a trigonally symmetric structure, a ground conductor on its bottom face, and a non-magnetic dielectric board between said metal disk and said ground conductor; and a ferrite magnetic body spontaneously magnetized and coaxially disposed on said metal disk of said microstrip $TM_{n10}$ resonator, on a side of said metal disk opposite said non-magnetic dielectric board, for turning electric field on said microstrip $TM_{n10}$ resonator so that a position of an electric field node matches to one of said branches.

2. The element as claimed in claim 1, wherein said ferrite magnetic body has a shape of a disk or a cylinder.

3. The element as claimed in claim 1, wherein said $TM_{n10}$ resonator is a $TM_{m10}$ resonator (m is a positive integer of 2 or more).

4. The element as claimed in claim 3, wherein said metal disk is partially removed around a central axis of said $TM_{m10}$ resonator.

5. The element as claimed in claim 4, wherein said ferrite magnetic body is partially removed around the central axis of said $TM_{m10}$ resonator.

6. The element as claimed in claim 5, wherein said ferrite magnetic body has a hole whose inner wall is metallized, said hole being formed by partially removing said ferrite magnetic body around the central axis.

7. The element as claimed in claim 1, wherein at least top and bottom faces of said ferrite magnetic body are metallized.

8. The element as claimed in claim 1, wherein said $TM_{n10}$ resonator is a $TM_{110}$ resonator, and wherein said ferrite magnetic body comprises a Faraday rotator with a ferrite cylinder that includes a metallized free end face and a propagation length of one wavelength.

9. The element as claimed in claim 8, wherein a non-magnetic dielectric body is coupled to said ferrite cylinder.

10. The element as claimed in claim 9, wherein a dielectric constant of said non-magnetic dielectric body is selected such that said ferrite cylinder and said non-magnetic dielectric body are equal to each other in characteristic impedance.

11. The element as claimed in claim 1, wherein ¼ wavelength impedance matching elements are connected to said branches, respectively.

12. The element as claimed in claim 1, wherein one terminal is connected to a matching resistor and other two terminals are formed as input and output terminals.

13. The element as claimed in claim 1, wherein said dielectric board is a millimeter-wave hybrid integrated circuit board.

14. A millimeter-wave hybrid integrated circuit board having at least one non-reciprocal circuit element, said element comprising:

a microstrip isotropic $TM_{n10}$ resonator (n is a positive integer) further comprising a metal disk including branches projecting from said metal disk in a trigonally symmetric structure, a ground conductor on its bottom face, and a non-magnetic dielectric board between said metal disk and said ground conductor; and a ferrite magnetic body spontaneously magnetized and coaxially disposed on said metal disk of said microstrip $TM_{n10}$ resonator, on a side of said metal disk opposite said non-magnetic dielectric board, for turning electric field on said microstrip $TM_{n10}$ resonator so that a position of an electric field node matches to one of said branches.

* * * * *

UNITED STATES PATENT AND TRADEMARK OFFICE
CERTIFICATE OF CORRECTION

| | | |
|---|---|---|
| PATENT NO. | : 6,433,649 B2 | Page 1 of 1 |
| DATED | : August 13, 2002 | |
| INVENTOR(S) | : Miura et al. | |

It is certified that error appears in the above-identified patent and that said Letters Patent is hereby corrected as shown below:

<u>Title page,</u>
Item [30], Foreign Application Priority Data, change "January 10, 1999" to be -- October 1, 1999 --

Signed and Sealed this

Eighteenth Day of February, 2003

JAMES E. ROGAN
*Director of the United States Patent and Trademark Office*